United States Patent [19]
Stern et al.

[11] Patent Number: 5,131,955
[45] Date of Patent: Jul. 21, 1992

[54] DEPOLYABLE RETRACTABLE PHOTOVOLTAIC CONCENTRATOR SOLAR ARRAY ASSEMBLY FOR SPACE APPLICATIONS

[75] Inventors: Theodore G. Stern; Mickey Cornwall, both of San Diego; Jon F. Lawrence, Escondido; David M. Peterson, San Diego, all of Calif.

[73] Assignee: General Dynamics Corporation/Space Systems Division, San Diego, Calif.

[21] Appl. No.: 640,760

[22] Filed: Jan. 14, 1991

[51] Int. Cl.⁵ .................. H01L 31/045; H01L 31/052
[52] U.S. Cl. ..................... 136/245; 136/246; 136/292; 244/173
[58] Field of Search ............ 136/245, 246, 292; 244/173

[56] References Cited
U.S. PATENT DOCUMENTS

| | | | |
|---|---|---|---|
| 4,153,474 | 5/1979 | Rex | 136/246 |
| 4,690,355 | 9/1987 | Hornung et al. | 244/173 |

OTHER PUBLICATIONS

T. G. Stern et al., *Conf. Record*, 17th *IEEE Photovoltaic Specialists Conference* (1984), pp. 326-329.
W. D. Ebeling et al., Proceedings Int'l Photovoltaic Solar Energy Conf. (1977), Reidel Pub. Co. (1978), pp. 1056-1070.
J. Davis, "Solar Cell R & D", *Space Aeronautics*, Apr. 1959, pp. 44-46.

*Primary Examiner*—Aaron Weisstuch
*Attorney, Agent, or Firm*—John R. Duncan; Frank D. Gilliam

[57] ABSTRACT

A deployable/retractable photovoltaic concentrator solar array assembly for space applications that includes a plurality of solar array panels that are carried by a pantograph arm arrangement that is deployable to position the panels in a predetermined canted arrangement for receipt of solar radiation. Each panel includes a plurality of spaced cylindrical off axis parabolic mirrors that concentrate the reflected light on a line that falls upon a series of photovoltaic cells arranged longitudinally along the back of each mirror. The cylindrical parabolic mirrors are aligned with the cylindrical axis perpendicular to the axis about which the panels are canted, so that such canting causes no loss of focus. The array panels may be hardened to resist perceived threats and the pantograph arm arrangement is operable to position the array panels in a preferred orientation according to the nature of the threat. A preferred method of making the parabolic concentrator mirrors and assembling them into array panels is disclosed.

14 Claims, 4 Drawing Sheets

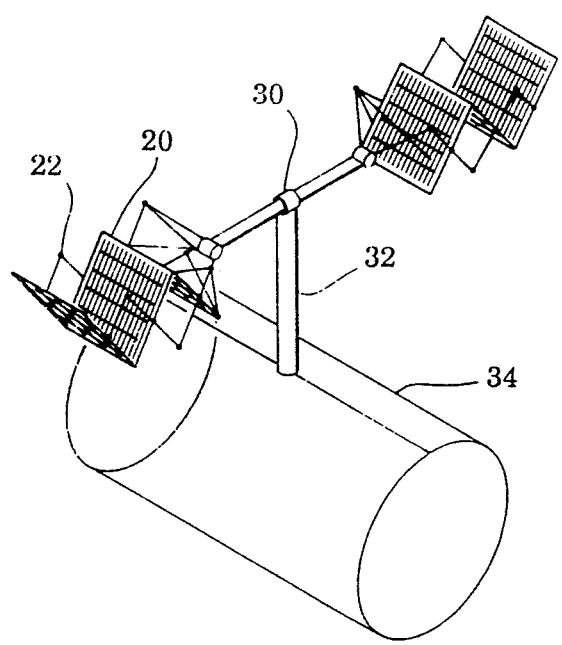
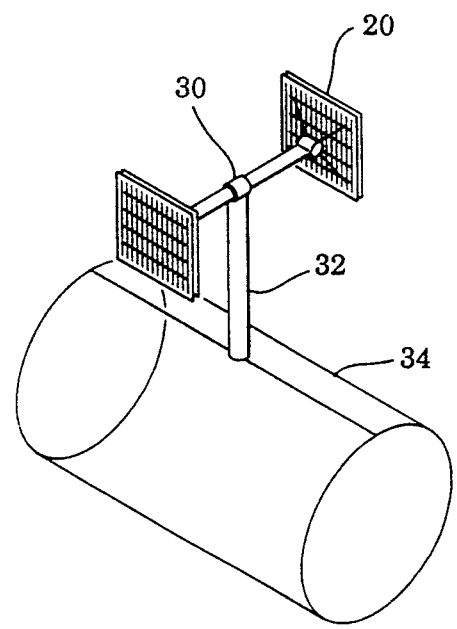
FIG. 6  FIG. 7
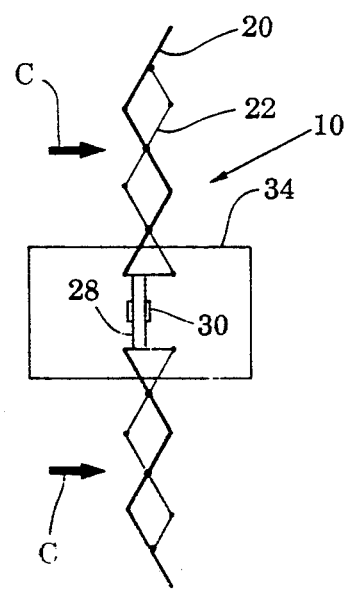
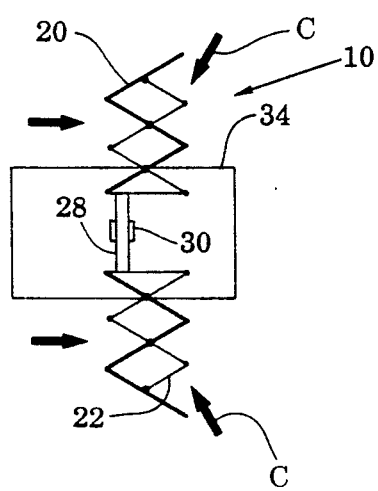
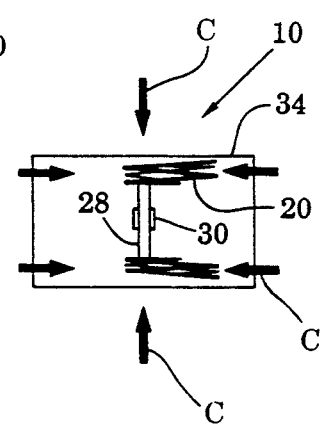
FIG. 8  FIG. 9  FIG. 10

DEPOLYABLE RETRACTABLE PHOTOVOLTAIC CONCENTRATOR SOLAR ARRAY ASSEMBLY FOR SPACE APPLICATIONS

BACKGROUND OF THE INVENTION

The present invention relates generally to an improvement in photovoltaic concentrator arrangements for space applications and more particularly, but not by way of limitation, to a deployable/retractable concentrator array arrangement which utilizes a pantograph arm arrangement to position a plurality of solar array panels in a predetermined intercoupled arrangement in a plurality of deployment arrangements.

A number of photovoltaic arrangements for converting sunlight into electricity have been proposed for space applications. For example, the proposed space station generally discloses large planar photovoltaic cell arrays that extend from each side of a support structure in an opposed arrangement. The present proposed planar photovoltaic arrangements clearly could be improved by an arrangement which would provide enhanced shielding against the natural and military threat environments while reducing the required area and cost of photovoltaic cells for a given power output. The present invention is believed to overcome the shortcomings of previously known planar photovoltaic cell arrangements for space applications while providing a number of advantages over those previously known planar photovoltaic cell arrangements.

SUMMARY OF THE INVENTION

Briefly stated, the present invention contemplates a plurality of spaced cylindrical off axis parabolic mirror elements that are positioned in a plurality of rows in a frame panel to provide an array. Each mirror focuses the incident light in a concentrated line that falls along a plurality of photovoltaic cells that are longitudinally arranged along the backside of an adjacent mirror. A plurality of such frame panels are coupled to a pantograph arm means which in a fully deployed position orient the frame panels in a canted interrelationship to each other. The mirrors are positioned such that their cylindrical axis is perpendicular to the axis about which the panels are canted to allow such canting without defocusing the mirrors. The pantograph arm means may orient the frame panels in other predetermined positions according to the nature of perceived threats including a fully retracted position wherein the panels are oriented in a parallel relationship.

A support arrangement for the pantograph arm means includes a rotary joint for pointing the frame panels and included solar cell arrays in an optimum direction to receive light. The support arrangement may be connected to a space structure such as a space station or a space craft.

A preferred method for making and assembling the semicylindrical parabolic mirrors includes cutting a metal mirror blank to a predetermined size and then passing the precut blank through a pair of opposed feed rollers while bending roller means is variably positioned with respect to the feed rollers to deform the mirror blank to the desired semi-cylindrical shape having a desired parabolic curvature extending longitudinally. Typically, metals that can be readily polished, such as aluminum, steel, nickel, copper, beryllium, titanium or silver are used, although any suitable metal may be used. The positioning of the bending roller means may be manually controlled or may be controlled by a numerical control program that directs the rollers and their cooperative spatial relationship to deform the mirror blank to the desired parabolic contour. Other means of forming the mirror blank to the desired shape bay be employed, such as roll-forming through a set of contoured rollers, or press-forming onto a shaped die. Contoured blanks could also be formed by extrusion. The metal mirror blank after deformation is polished to the desired mirror finish. The mirrors are spring loaded into apertures having complementary curvature in the frame panel to allow for differential thermal expansion experienced by the mirrors with respect to the frame panel resulting from orbital heating profiles and certain military threats. Biasing means carried by the panel means cooperate with each mirror to assist in maintaining the mirror in its desired contour.

Further features and advantages of the invention will be evident from the detailed description, when read in conjunction with the accompanying drawings which illustrate the invention.

BRIEF DESCRIPTION OF THE DRAWINGS

FIG. 6 is a simplified perspective that shows the arrangement in a partially retracted state;

FIG. 7 is a simplified perspective which illustrates the arrangement in its fully retracted position;

FIG. 8 is a simplified schematic that illustrates how the array arrangement may be rotated in a deployed state to meet a perceived threat;

FIG. 9 is a simplified schematic that illustrates the array arrangement that has been partially retracted to an alert position to face a perceived threat;

FIG. 10 is a simplified schematic that illustrates the array arrangement that has been fully rotated and retracted to provide full hardness from all angles and to all threats;

DETAILED DESCRIPTION OF THE DRAWINGS

Figure 1:
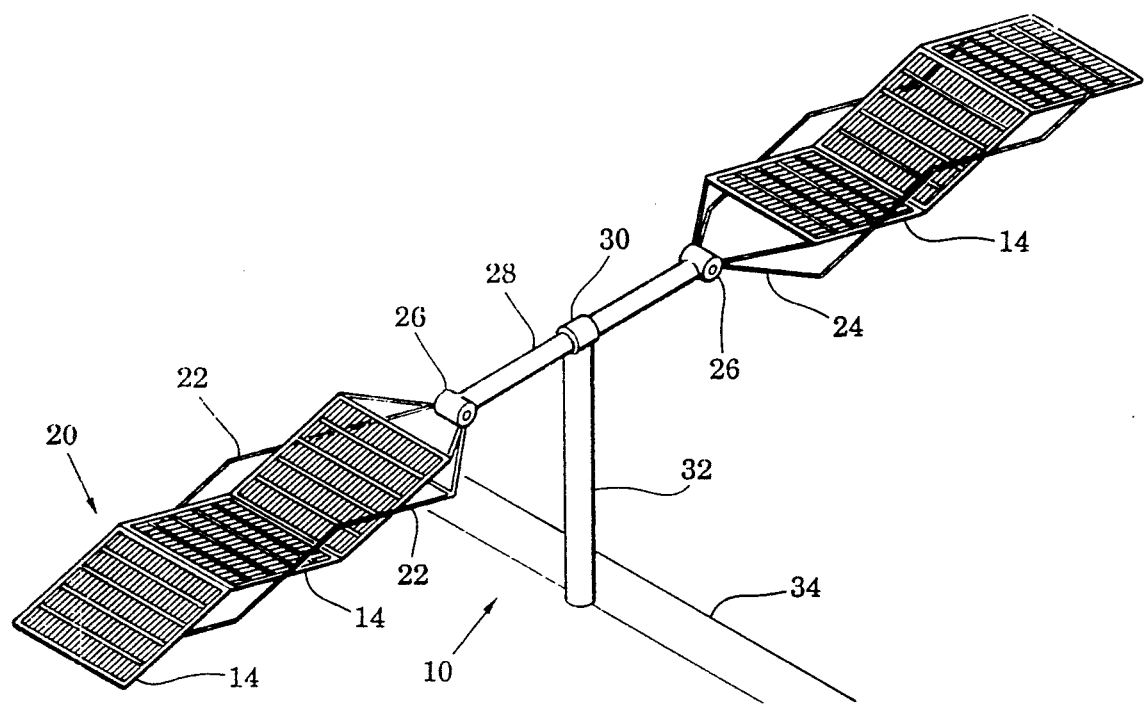
FIG. 1 is a simplified perspective of a deployable/retractable photovoltaic concentrator array arrangement constructed in accordance with a preferred embodiment of the invention that is intended for space applications.
Figure 2:
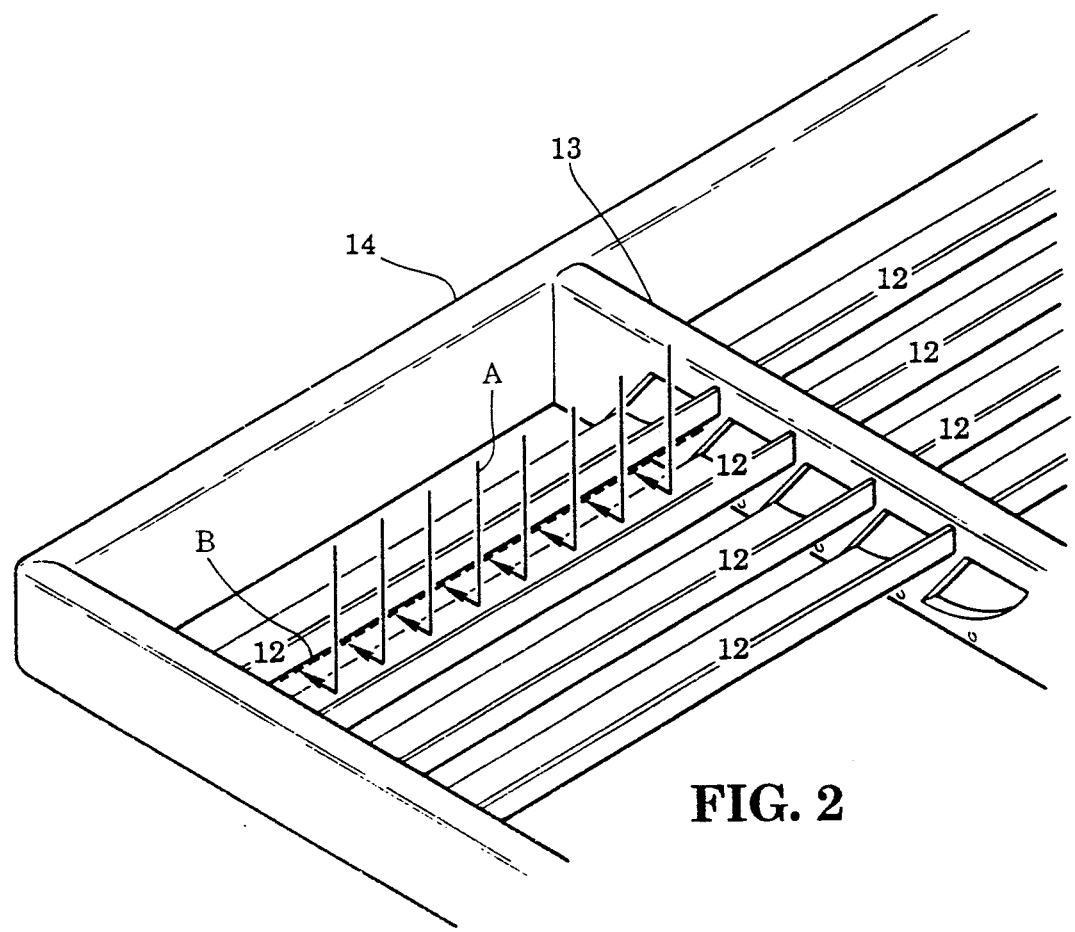
FIG. 2 is a partial detail perspective of the mirror arrangement used to concentrate incident light with a parabolic mirror onto a photovoltaic cell arrangement disposed on the backside of an adjacent mirror.

Referring now to the drawings in detail, and in particular to FIG. 1, reference character 10 designates a photovoltaic array arrangement constructed in accordance with a preferred embodiment of the present invention. The array arrangement 10 includes a plurality of spaced semi-cylindrical parabolical mirrors 12 that are disposed in a parallel relationship, as seen in FIG. 2. The mirrors 12 may be arranged in parallel rows. Typically, the mirrors may be arranged in four to eight rows of sixteen to fifty mirrors each in a planar configuration. The mirrors are arranged to form a panel 14. The frame 13 of panel 14 is preferably of a hollow beam construction and is formed of an advanced composite material, such as graphite-epoxy, for purposes of strength, rigidity, lightness, and minimal reaction to thermal changes. A method of making and assembling the mirrors 12 in the frame 13 will be described more fully hereinafter.

Figure 3:
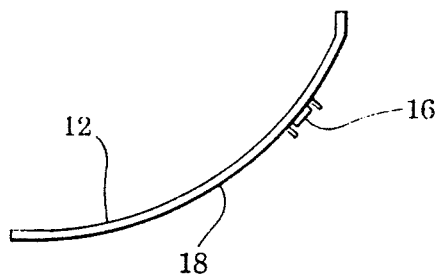
FIG. 3 is a cross section of a parabolic mirror shown in FIG. 2.

Each semi-cylindrical parabolic concentrator mirror receives incident sunlight A through the mirror aperture and reflects it forwardly in a line focus B shown by a dotted line on the backside of the adjacent mirror 12. The adjacent mirror 12 has a string of suitable solar cells 16 mounted on its backside 18, as seen most clearly in FIG. 3. It is to be understood that the mirrors 12 are positioned parallel to the axis of the frame 13 so that canting of a panel 14, as will be described more fully hereinafter, does not cause the focal line B of the reflected light to move off of the photovoltaic cell string 16 but rather to move along the length of the solar cell string 16, thus causing only a small loss of light along the string 16.

Referring again to FIG. 1, it will be seen that a plurality of panels 14 containing the solar concentrator elements 12 are hingedly connected at their sides to form one foldable unitary panel 20. The foldable panel 20 is hingedly connected at opposing ends to a pantograph arm assembly 22 to provide for an unfolded or deployed state as seen in FIG. 1. The pantograph arm assembly 22 which extends along the sides of the unitary panel 20 also includes at one end a suitable yoke arrangement 24 that is connected to a motorized rotary joint 26 positioned inboard of the unitary solar panel arrangement 20. The motorized rotary joint 26 provides a drive means to deploy or retract the solar array panels through actuation of the pantograph arm assembly 22.

The pantograph arm assembly deployment 22 provides a structure that maintains a high degree of rigidity without locking joints and also provides full or partial retraction of the foldable panel 20 to avoid perceived threats. The pantograph arm assembly 22 provides a greater structural depth, in comparison to the previously known planar solar panels, which improves the stiffness and natural frequency of the arrangement 10, and provides the ability to deploy and accurately point kilowatt size arrays without having to use backtrusses.

The pantograph arm assembly 22 is coupled through the rotary joint 26 to an arm member 28 extending longitudinally along the axis of the assembly 22. The arm member 28 is provided with a suitable motorized rotary joint 30 that permits rotation of the pantograph assembly 22 along its longitudinal axis to permit pointing of the solar panels in an optimum position to receive incident light. The rotary joint 30 is supported by a second arm member 32 which supports and spaces the solar arrangement 10 from a space structure 34 which may, for example, be a space station or a space craft such as the space shuttle.

The pantograph support assembly 22 when extended to deploy the solar panels 14 cants such panels 14 with respect to one another and, since each concentrator element 12 creates a line focus on the adjacent solar cell string 16, requires accurate pointing of the arrangement 10 in one axis only. Since the pantograph support system 22 provides a "scissors" mechanism to support the solar array panels 14 in a coupled canted arrangement it is possible to provide easy deployment and retraction of the arrangement 10, as seen in FIGS. 8 to 10, while maintaining pointing of the unitary array panel 20 in the axis orthogonal to the pantograph axis. By orienting the semicylindrical parabolic concentrator elements 12 parallel to the pantograph support assembly 22, the pointing requirements for a semi-cylindrical concentrator reflector 12 are met while still allowing the panels 14 to be canted.

The rotary joint 26 may provide a direct drive of the inboard arms of the pantoqraph support assembly 22 by use of a suitable yaw tracking motor with a switch latch for dual purposes. However, it is within the scope of the invention to provide other arrangements to separate the arms of the pantograph assembly 22 as they are deployed. For example, a linear actuator could be disposed between the midpoints of the deployment arms to provide linear separation of the pantograph arms. Also, a lanyard and spring arrangement could be provided where springs tension the panels 14 out for deployment and a lanyard and a motor could be used to reel or fold in the unitary panel 20 for retraction.

Referring again to FIGS. 8 to 10, it will be seen how the arrangement 10 may be advantageously manipulated in response to perceived threats. For ease of illustration, the member 28 has been shown as substantially shortened. While a passive shielding is inherent in the disposition of the solar cell string 16 with respect to its adjacent concentrator element 12, hardening of the solar array panels may be provided if deemed to be required or necessary. In FIG. 8 the arrangement 10 is in a deployed state in which the pantograph arm support assembly 22 has been rotated by the rotary joint 30 to present the backside of the unitary solar panel 20. Thus, full backside hardness is provided to the perceived threat as illustrated by the arrows C while maintaining some frontside hardness.

In FIG. 9, the assembly 10 has been partially retracted into an alert mode which provides full backside hardness and reduced frontside vulnerability to threats C.

In FIG. 10, the arrays 20 have been fully retracted so that the arrays 14 have been folded into a generally parallel relationship. Thus, this mode provides full harness from all angles and threats. An additional enclosure (not shown) may also be provided to shield against intense threats. It will be understood that the assembly in its fully deployed state as seen in FIG. 1 also provides a level of passive hardness which is enhanced by the rotation and retraction options discussed above. Another aspect of the present invention is the method provided to make the mirrors 12 and to assemble them within the panel 14.

Figure 4:
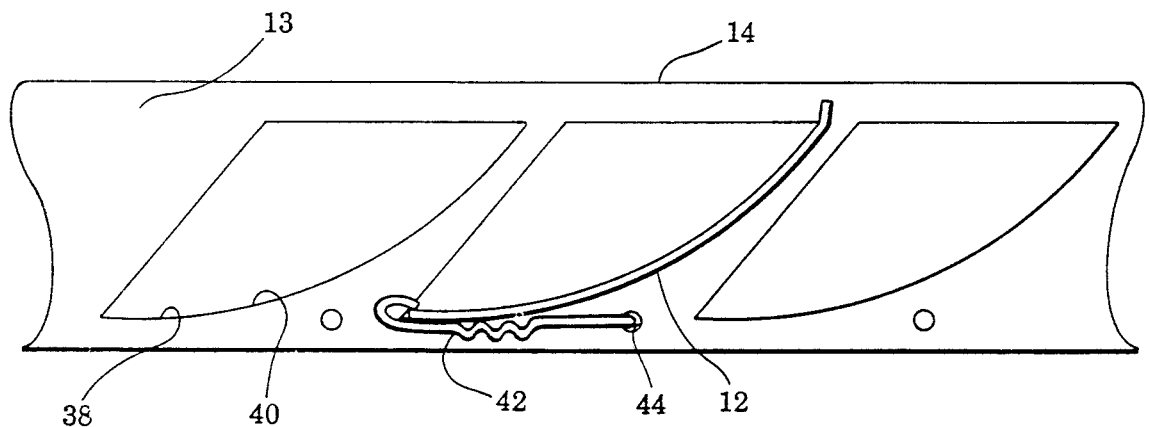
FIG. 4 is a fragmentary perspective of the panel frame used to mount the parabolic mirrors.
Figure 5:
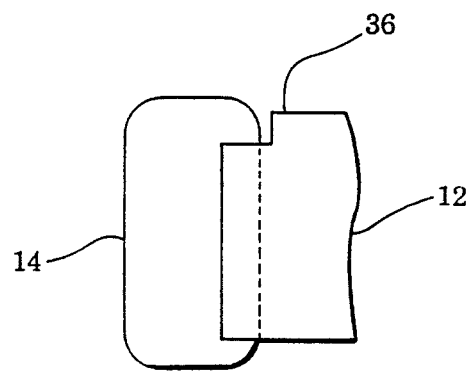
FIG. 5 is a cross section of the panel frame of FIG. 4 which illustrates the mounting of a parabolic mirror therein.

Referring initially to FIGS. 4 and 5, it will be seen that each mirror 12 is provided at each end with a cut out portion 36 to provide an indexed stop. The frame 13 is provided with rows of mirror mounting apertures 38 each of which is provided with one surface 40 that is provided with a contour conforming to the contour of the parabolic mirror 12. Alternatively, a set of support pins may extend from the frame surface that are tangential to the mirror backside contour at key locations to provide a supporting shelf. Each mirror 12 may be momentarily deformed to permit the insertion of the ends thereof in the frame 13. Each mirror 12 preferably has at least one degree of freedom in the apertures 38 to permit thermal growth without deformation or buckling of the mirrors 12. A biasing means in the form of a spring 42 secured at one end to an aperture 44 in the frame 13 and at the other end to an edge of the mirror 12 urges the mirror 12 into contour maintaining contact with the surface 40 of the aperture 38. Such growth is permitted longitudinally by expansion into the cutout and along the contour by flexure of the mounting spring 42.

Figure 11:
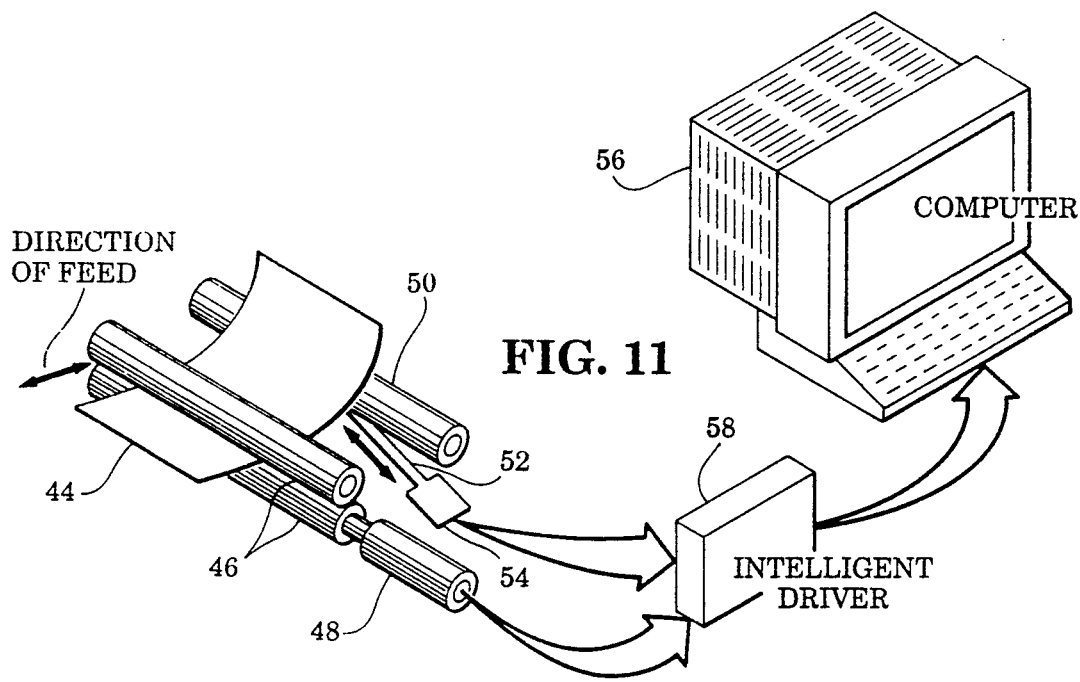
FIG. 11 is a simplified perspective of a system that may be used to form the parabolic mirrors used in the array arrangement of the present invention.

Referring now to FIG. 11, a method of deforming a mirror 12 to its desired parabolic contour is disclosed. A precut metal mirror blank 44 is drawn by a pair of opposed feed rollers 46, one or both of which may be driven by a suitable stepper motor 48. The mirror blank may be fabricated from almost any metal, although typically, easily polished, lightweight blanks of aluminum, steel, copper, nickel, beryllium, titanium, or silver are used. A bending roller 50 is positioned adjacent to the feed rollers 46 and is variably positioned with respect thereto by a linear actuator 52, for example a worm-gear drive, that is driven by a suitable stepper motor 54. A computer 56 is coupled through an intelligent driver 58 to the stepper motors 48 and 54. A suitable numerical control program is used by the computer 56 to operate stepper motors 48 and 54 to permanently deform a metal mirror blank to the desired contour of the semi-cylindrical parabolic mirror.

Figure 12:
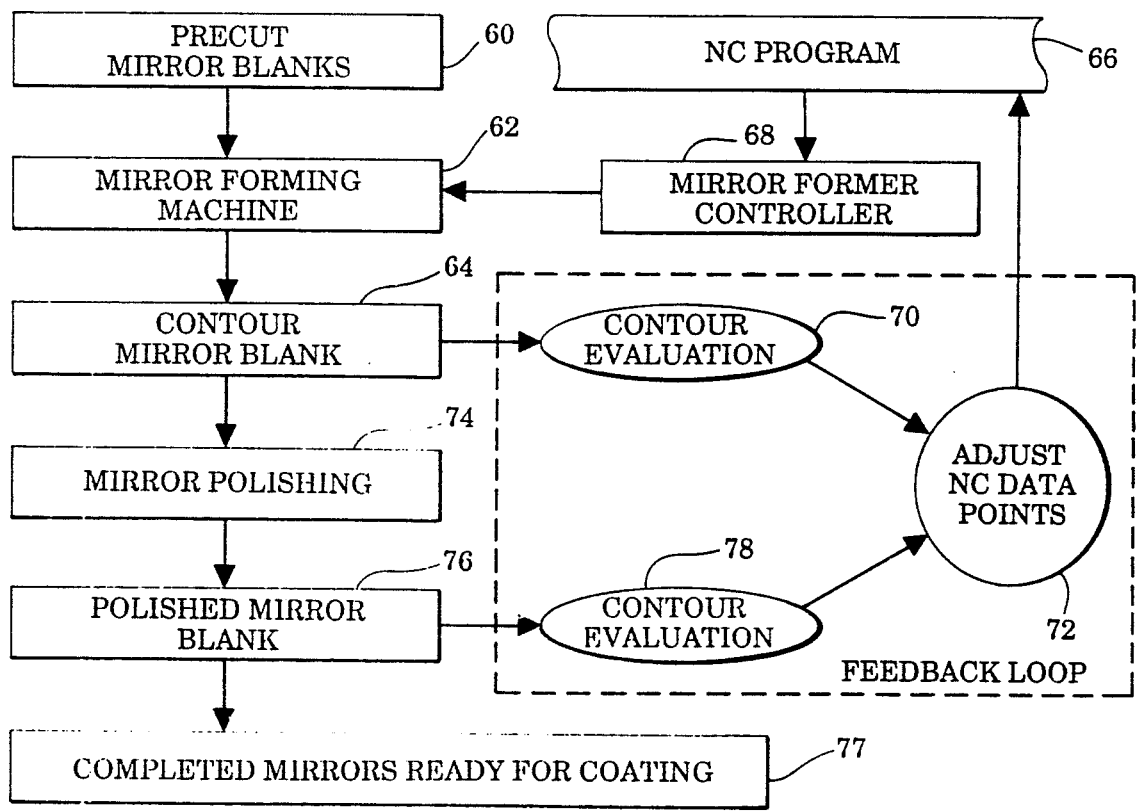
FIG. 12 is a diagram illustrating a presently preferred process used to make the parabolic mirrors.

A work flow process for developing the proper contour for production mirror blanks is illustrated in FIG. 12. Suitable metal mirror blanks are precut to a desired shape in step 60 and then fed through a mirror forming machine (seen in FIG. 11) in step 62 to form the desired contoured mirror blank at step 64. A suitable numerical control program 66 acts through a mirror former controller means 68 to control the mirror forming machine 62 as seen in FIG. 11. A suitable feedback loop is provided in this process by evaluating the contour of the semi-finished blank 44 at step 70 and adjusting the NC data points at step 72, which adjusted NC data points are coupled to the NC program 66.

Preferably, the mirror blank 44 after contouring is subjected to a suitable polishing step 74 to provide a polished mirror blank at step 76, the contour of the polished mirror blank then being subjected to a final contour evaluation at step 78 for further adjustment of the NC program 66 as necessary. Alternatively, the flat mirror blank could be polished prior to forming to reduce process costs. Coating of the mirror blank 44 may be accomplished as necessary to provide the final mirror 12 per step 77.

Assembly of the mirrors 12 into frame members of the panel 14 to provide a planar solar array panel has been described in the description of FIGS. 4 and 5.

In summary, the present invention provides a novel deployable/retractable solar array arrangement having modular concentrating photovoltaic elements. A pantograph arm assembly provides manipulation of the solar array panels to provide enhanced shielding against natural and military threat environments and a reduction in required area for a given power output. Easy deployment and retraction are combined with ease of pointing the solar arrays for optimum power output. A novel method of fabricating the concentrating mirror elements and assembling solar array panels for the arrangement of the invention has been provided.

Changes may be made in the combination and arrangement of parts or elements as heretofore set forth in the specification and shown in the drawings, it being understood that changes may be made in the precise embodiment shown without departing from the spirit and scope of the invention as defined in the following claims.

We claim:

1. An arrangement for supporting a photovoltaic cell arrangement in space which comprises:
    a plurality of cylindrical off-axis parabolic mirrors having reflection mirror portions disposed in a spaced parallel arrangement so that incident light received by each mirror is reflected forwardly to focus on a line spaced from the back of the adjacent mirror;
    a photovoltaic cell means arranged on the side of each parabolic mirror opposing a reflective surface of the adjacent mirror and adapted to receive concentrated light focused thereon by an adjacent parabolic mirror;
    support means to support the parabolic mirrors in at least one planar array arrangement, said support means comprising a resilient biasing means associated with each of said plurality of cylindrical off-axis parabolic mirrors for urging the mirrors into contour maintaining contact with said support means, said biasing means secured at one end to said support means and at the other end to an edge of said mirrors, each of said plurality of cylindrical off-axes mirrors being loosely disposed in said support means prior to the application of said biasing means so as to permit thermal growth of said cylindrical off-axes mirrors relative to said support means;
    adjustable arm means to variably position said support means so as to permit the incident light to impinge upon the parabolic mirrors in an optimum manner and to dispose the support means in a preferred manner to withstand or avoid perceived threats.

2. The arrangement of claim 1 wherein the support means comprises a frame means adapted to support a plurality of the parabolic mirrors that are arranged in a plurality of spaced parallel rows.

3. The arrangement of claim 2 wherein the support means includes a plurality of frame means which are coupled together so as to permit incident light to be received by each parabolic mirror.

4. The arrangement of claim 3 wherein each frame means is so coupled to another frame means as to permit each frame means to be canted with respect to an adjacent frame means when the arrangement is in a fully deployed state.

5. The arrangement of claim 4 wherein the adjustable arm means includes an adjustable pantograph arm means which is hingedly connected to opposing sides of the frame means whereby when the pantograph frame means is fully deployed each frame means is canted with respect to an adjacent frame means so that the parabolic mirrors carried by each frame means may receive incident light.

6. The arrangement of claim 1 wherein each parabolic mirror is provided with a protection means against perceived threats on the sides opposing the reflection mirror portion.

7. The arrangement of claim 5 wherein the support means includes at least one rotary joint which permits rotation of the pantograph arm means to a predetermined position.

8. The arrangement of claim 7 wherein the support means further includes a first member connected to the rotary joint and to the pantograph arm means to enable the frame means supporting the parabolic mirrors to be deployed a predetermined distance form the rotary joint.

9. The arrangement of claim 8 wherein the support means also includes a second member coupled to the rotary joint and disposed orthogonally to the first member for spacing the pantograph arm means a predetermined distance from a structure in space.

10. The arrangement of claim 5 wherein the pantograph arm means includes a pair of spaced pantograph arm arrangements that are connected to opposing sides of the frame members and to a yoke arrangement at the end of the arm arrangements.

11. The arrangement of claim 10 wherein the pantograph arm means further includes a rotary joint means that is coupled to the yoke and to the pantograph arm arrangements whereby the pantograph arm members may be drawn inwardly to a fully retracted position which positions the panel members in a closed parallel arrangement and the pantograph arm members may be driven to a fully extended position to position the panel members in a determined canted position with respect to each other to receive incident light.

12. The arrangement of claim 2 wherein each parabolic mirror comprises a semi-cylindrical mirror that has a parabolic shaped surface that is provided with a mirrored surface on its concave side and further provided with indent portions at opposing ends of the mirror along the longitudinal axis of the mirror.

13. The arrangement of claim 12 wherein each end of a parabolic mirror is positioned in an aperture in the frame means that has at least one surface that is complimentarily contoured to receive the end of the mirror.

14. The arrangement of claim 13 wherein said biasing means is carried by the frame means and coupled to each mirror or urge the mirror in the aperture against the complementary parabolic shape.

* * * * *